(12) United States Patent
Suzuki

(10) Patent No.: US 9,383,392 B2
(45) Date of Patent: Jul. 5, 2016

(54) CURRENT SENSOR

(75) Inventor: Toshikazu Suzuki, Tokyo (JP)

(73) Assignee: JAPAN AVIATION ELECTRONIC INDUSTRY, LIMITED, Tokyo (JP)

( * ) Notice: Subject to any disclaimer, the term of this patent is extended or adjusted under 35 U.S.C. 154(b) by 183 days.

(21) Appl. No.: 14/350,502

(22) PCT Filed: Jul. 11, 2012

(86) PCT No.: PCT/JP2012/067708
§ 371 (c)(1),
(2), (4) Date: Apr. 8, 2014

(87) PCT Pub. No.: WO2013/088766
PCT Pub. Date: Jun. 20, 2013

(65) Prior Publication Data
US 2014/0239946 A1 Aug. 28, 2014

(30) Foreign Application Priority Data
Dec. 13, 2011 (JP) ................................ 2011-272378

(51) Int. Cl.
*G01R 19/00* (2006.01)
*G01R 15/18* (2006.01)
*G01R 33/02* (2006.01)

(52) U.S. Cl.
CPC .......... *G01R 19/0092* (2013.01); *G01R 15/183* (2013.01); *G01R 33/02* (2013.01)

(58) Field of Classification Search
CPC .... G01R 19/0092; G01R 15/18; G01R 15/20; G01R 15/148; G01R 15/183; G01R 15/207; G01R 19/20; G01R 33/02; G01R 33/09; G01R 19/00; H01F 38/28; H01F 38/32
USPC ............. 324/244–252, 260, 344, 127, 117 R, 324/117 H, 713
See application file for complete search history.

(56) References Cited

U.S. PATENT DOCUMENTS 2,712,635 A 7/1955 Borg
2,760,158 A 8/1956 Kerns
(Continued)

FOREIGN PATENT DOCUMENTS

DE 893091 10/1953
DE 19608246 9/1997
(Continued)

OTHER PUBLICATIONS

Toshikatsu Sonoda et al. ("A Current Sensor of High Response and High Sensitivity", Conference Record of the Industry Applications Society Annual Meeting. Seattle, Oct. 7-12, 1998; [Conference Record of the Industry Applications Society Annual Meeting], New York, IEEE, US, vol. Meeting 25, Oct. 7, 1998 (1998-18-87), pp. 626-631, XP808284889.*

(Continued)

*Primary Examiner* — Son Le
(74) *Attorney, Agent, or Firm* — Greenblum & Bernstein, P.L.C.

(57) ABSTRACT

A current sensor includes: two cores that configure closed magnetic circuits surrounding a conductor where a current to be measured flows and are arranged adjacent to each other; two coils that are wound respectively around the two cores and are connected in series to generate a magnetic flux in surrounding directions opposite to each other in the two cores; an excitation power supply that applies an alternating current with a superimposed direct current to the two coils; and a detection circuit that is connected to a connection point of the two coils. It is possible to obtain the current sensor being capable of high precision measurement up to high frequencies and also capable of reducing power consumption.

9 Claims, 8 Drawing Sheets

(56) References Cited

U.S. PATENT DOCUMENTS

| | | | |
|---|---|---|---|
| 2,892,155 A | 6/1959 | Radus et al. | |
| 3,430,142 A * | 2/1969 | Covert | G01R 19/20 324/117 R |
| 4,626,777 A | 12/1986 | Ainsworth | |
| 5,717,326 A | 2/1998 | Moriwaki | |

FOREIGN PATENT DOCUMENTS

| | | |
|---|---|---|
| JP | S64-003568 | 1/1989 |
| JP | 03-162688 | 7/1991 |
| JP | H07-270507 | 10/1995 |
| JP | 08-273952 | 10/1996 |
| JP | 2001-228181 | 8/2001 |

OTHER PUBLICATIONS

Japan Office Action (together with English language translation thereof), mailed May 20, 2014, for corresponding Japanese Patent Application No. 2011-272378.

Guillermo Velasco-Quesada et al., "Design of a Low-Consumption Fluxgate Tranducer for High-Current Measurement Applications", IEEE Sensors Journal, IEEE Service Center, New York, NY, U.S., vol. 10, No. 2, XP011318711, Feb. 1, 2011, pp. 280-287.

Toshikatsu Sonoda et al., "An ac and dc Current Sensor of High Accuracy", IEEE Transactions on Industry Applications, IEEE Service Center, Piscataway, NJ, U.S., vol. 28, No. 5, XP000311409, Sep. 1, 1992, pp. 1087-1093.

Toshikatsu Sonoda et al., "A Current Sensor of High Accuracy Fit for Precise and Exact Motion Control", Conference Record of the 1989 IEEE Industry Applications Society Annual Meeting, Part I (IAS). San Diego, Oct. 1-5, 1989; New York, IEEE, U.S., vol. PART 01, XP000093303, Oct. 1, 1989, pp. 343-347.

Toshikatsu Sonoda et al., "A Current Sensor of High Response and High Sensitivity", Conference Record of the Industry Applications Society Annual Meeting. Seattle, Oct. 7-12, 1990; New York, IEEE, U.S., vol. Meeting 25, XP000204089, Oct. 7, 1990, pp. 626-631.

Extended European Search Report, mailed Mar. 19, 2015, from the European Patent Office, in corresponding European Patent Application No. 12858139.4.

Japan Office Action (together with English language translation thereof), mailed Mar. 4, 2014, for corresponding Japanese Patent Application.

* cited by examiner

CURRENT SENSOR

TECHNICAL FIELD

The present invention relates to a current sensor that measures a current flowing through a conductor.

BACKGROUND ART

Conventionally, as a current sensor that measures a DC current, namely a direct current and an AC current, namely an alternating current flowing through a conductor, a flux gate current sensor of (for example, refer to Patent Literature 1) and a hall element current sensor are known.

Although being capable of high precision measurement, the flux gate current sensor has a problem in that, because a core with an exciting coil wound therearound has to be magnetically saturated with an AC current, the excitation current increases and power consumption is large. In addition, in order to measure an AC current at a frequency exceeding several kHz, the excitation frequency has to become high; however, as the excitation frequency becomes high, the impedance of the exciting coil increases and a high voltage is required to flow a current for magnetic saturation of the core. Accordingly, another problem is that, because a large scale power supply is required as an AC (alternating current) excitation power supply and thus the flux gate current sensor is not capable of raising the excitation frequency, measurement at high frequencies is not possible.

In the meanwhile, although being capable of measuring from DC (direct current) up to approximately 100 kHz, the hall element current sensor has problems such as a change due to the temperature of a bias voltage of a hall element and have been unsuitable for high precision measurement.

PRIOR ART LITERATURE

Patent Literature

Patent literature 1: Japanese Patent Application Laid Open No. 2001-228181

SUMMARY OF THE INVENTION

Problems to be Solved by the Invention

It is an object of the present invention to provide a current sensor being capable of high precision measurement up to high frequencies and also capable of reducing power consumption.

Means to Solve the Problems

According to a first aspect of the present invention, a current sensor comprises: two cores that configure closed magnetic circuits surrounding a conductor where a current to be measured flows and are arranged adjacent to each other; two coils that are wound respectively around the two cores and are connected in series to generate a magnetic flux in surrounding directions opposite to each other in the two cores; an excitation power supply that applies an AC current with a superimposed DC current to the two coils; and a detection circuit that is connected to a connection point of the two coils.

According to a second aspect of the present invention, a current sensor comprises: two cores that configure closed magnetic circuits surrounding a conductor where a current to be measured flows and are arranged adjacent to each other; first and fourth coils that are wound around one of the two cores to generate a magnetic flux in the same surrounding direction; a second coil that is connected in series to the first coil and is wound around the other of the two cores to generate a magnetic flux in a surrounding direction opposite to the surrounding direction of the magnetic flux generated by the first coil; a third coil that is connected in series to the fourth coil and is wound around the other of the two cores to generate a magnetic flux in a surrounding direction opposite to the surrounding direction of the magnetic flux generated by the fourth coil; an excitation power supply that applies an AC current with a superimposed DC current to the first and second coils and applies the AC current to the third and fourth coils; and a detection circuit that is connected to a connection point of the first coil and the second coil and a connection point of the third coil and the fourth coil.

Effects of the Invention

According to the present invention, unlike a conventional flux gate current sensor, it is not required to excite a core until the core is magnetically saturated, that is, the core is not magnetically saturated, so that it is possible to reduce power consumption.

In addition, unlike a conventional hall element current sensor, a temperature-dependent bias is not used, so that it is possible to carry out high precision measurement. Further, the amplitude of an AC excitation voltage may be small, so that it is possible to apply a high frequency, and therefore, it is possible to obtain a current sensor being capable of measuring up to high frequencies.

DETAILED DESCRIPTION OF THE EMBODIMENTS

Descriptions are given below to embodiments of the present invention.

First Embodiment

Figure 1:
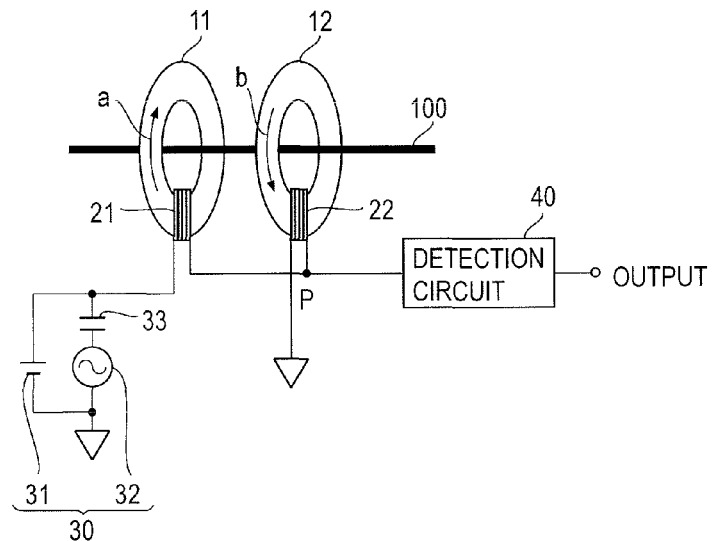
FIG. 1 is a diagram schematically illustrating a configuration in a first embodiment of a current sensor according to the present invention.
Figure 2:
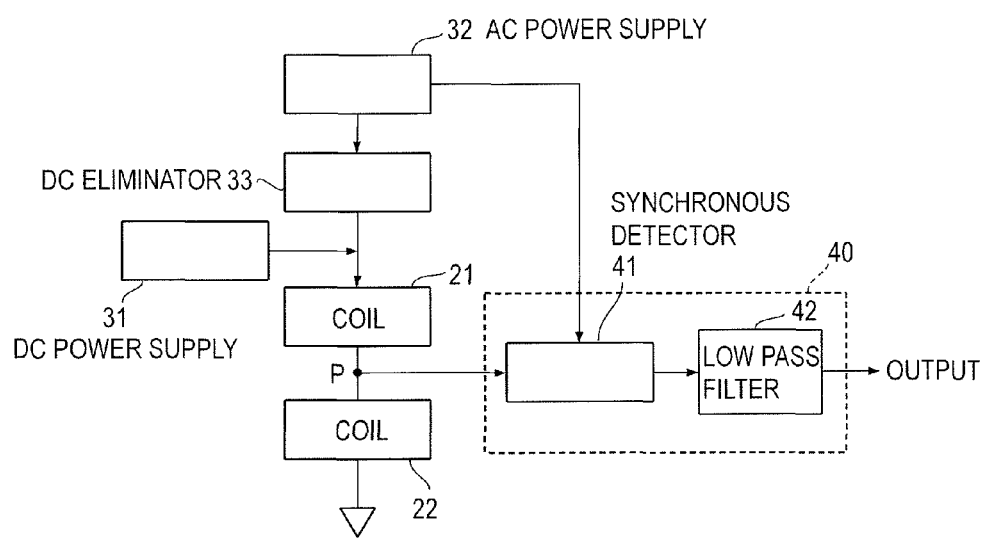
FIG. 2 is a block diagram illustrating a functional configuration in the first embodiment of a current sensor according to the present invention.

FIG. 1 schematically illustrates a configuration in a first embodiment of a current sensor according to the present invention, and FIG. 2 illustrates a functional configuration of the current sensor illustrated in FIG. 1 as a block diagram.

Cores 11, 12, which configure closed magnetic circuits surrounding a conductor 100 where a current to be measured flows, are made of a highly permeable magnetic material, such as permalloy; the cores are assumed to be toroidal cores in this case and to be in an identical shape. The two cores 11, 12 are arranged adjacent to each other, and the core 11 has a coil 21 wound therearound and the core 12 has a coil 22 wound therearound. The coils 21, 22 are connected in series to generate a magnetic flux in surrounding directions opposite to each other in the cores 11 and 12 when a current is applied to the coils 21, 22.

To one end of the one coil 21, an excitation power supply 30 is connected. The excitation power supply 30 comprises a DC power supply 31 and an AC power supply 32, and is capable of applying an AC current with a superimposed DC current to the coils 21, 22. In FIG. 1, 33 denotes a DC eliminator (capacitor).

By the DC power supply 31, a DC current is applied to the coils 21, 22, which generates a DC magnetic flux respectively in the cores 11 and 12. In FIG. 1, arrows a, b exemplify respective directions of the magnetic flux generated by the coils 21 and 22, and the magnetic flux generated by the coils 21 and 22 becomes opposite to each other in the surrounding directions of the cores 11, 12.

Figure 3:
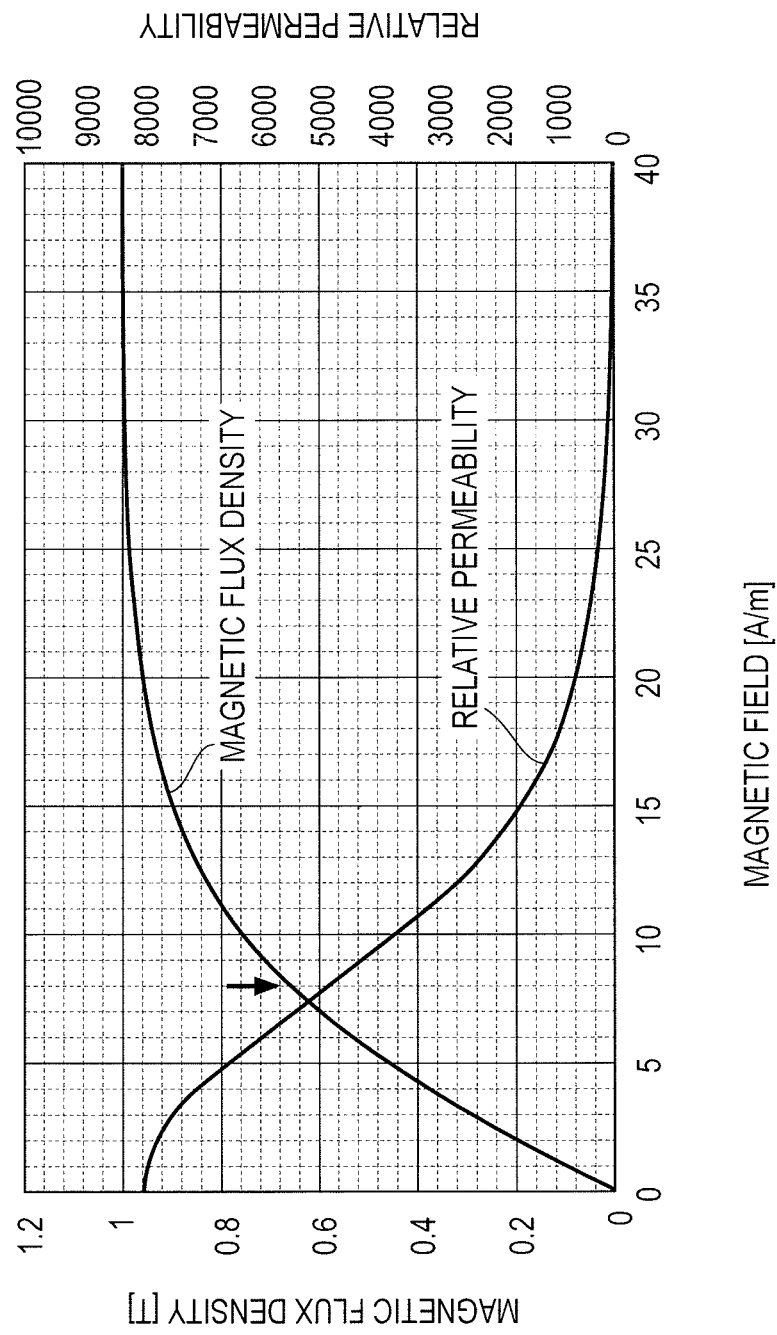
FIG. 3 is a graph illustrating a B-H curve and relative permeability.

FIG. 3 illustrates a B-H curve and relative permeability of the cores 11, 12, and the DC current to be applied to the coils 21, 22 is set to generate, for example, a DC magnetic field of approximately 8 A/m. The value of the magnetic field, 8 A/m, is placed almost at the middle in a region where the relative permeability changes linearly relative to the magnetic field.

The coils 21, 22 are assumed to have an identical number of turns, and an inductance L1 of the coil 21 and an inductance L2 of the coil 22 are equal. In a connection point P of the coil 21 and the coil 22, an AC voltage with a superimposed DC voltage is generated by the excitation power supply 30 comprising the DC power supply 31 and the AC power supply 32. An AC voltage Vd in the connection point P is expressed by the following, where Vac is an AC excitation voltage of the excitation power supply 30:

$$Vd = (L2/(L1+L2)) \cdot Vac \quad (1)$$

and the inductances L1, L2 of the coil 21 and the coil 22 are equal when the current flowing through the conductor 100 (current to be measured) is 0, so that the AC voltage Vd in the connection point P becomes ½ of the AC excitation voltage Vac.

In the meanwhile, when a current flows through the conductor 100, a magnetic flux proportional to the current is generated in the two cores 11, 12. This causes, for example, the magnetic flux to be enhanced by each other in the core 11 and the magnetic flux cancels each other in the core 12. Therefore, the respective magnetic flux density inside the cores 11, 12 change.

When the magnetic flux density change, as understood from FIG. 3, the relative permeability of the cores 11, 12 changes. In the core 11, since the magnetic flux density increases, the relative permeability decreases, while in the core 12, since the magnetic flux density decreases, the relative permeability increases. Due to the change of relative permeability, the inductance L1 of the coil 21 decreases and the inductance L2 of the coil 22 increases. Accordingly, from the formula (1), the AC voltage Vd in the connection point P becomes greater than the value assumed when the current flowing through the conductor 100 is 0, that is, Vd becomes greater than ½ of the AC excitation voltage Vac.

In such a manner, the AC voltage Vd in the connection point P of the two coils 21, 22 changes depending on the current flowing through the conductor 100, so that detection of the AC voltage Vd in the connection point P enables measurement of the current flowing through the conductor 100.

A detection circuit 40 is connected to the connection point P of the coils 21, 22. The detection circuit 40 in this case comprises, as illustrated in FIG. 2, a synchronous detector 41 and a low pass filter 42. The synchronous detector 41 synchronously detects the voltage in the connection point P using the AC excitation voltage Vac of the excitation power supply 30. The low pass filter 42 smooths an output of the synchronous detector 41. The synchronously detected voltage becomes an output Vo after passing through the low pass filter 42.

The detection circuit 40 is supposed to obtain the output Vo in such a manner. Since the output Vo is responsive (proportional) to the current flowing through the conductor 100, it is possible to measure the current flowing through the conductor 100 by the output Vo.

As described above, in this case, unlike the conventional flux gate current sensor, it is not required to excite the cores 11, 12 until these cores are magnetically saturated, that is, the cores 11, 12 are not supposed to be magnetically saturated. Accordingly, the excitation current (DC current) may be small and the amplitude of the AC excitation voltage may also be small, thereby making it possible to reduce power consumption compared with the conventional flux gate current sensor. In addition, since the amplitude of the AC excitation voltage may be small, it is possible to apply a high frequency, and therefore, it is possible to carry out high precision measurement up to high frequencies.

Second Embodiment

Figure 4:
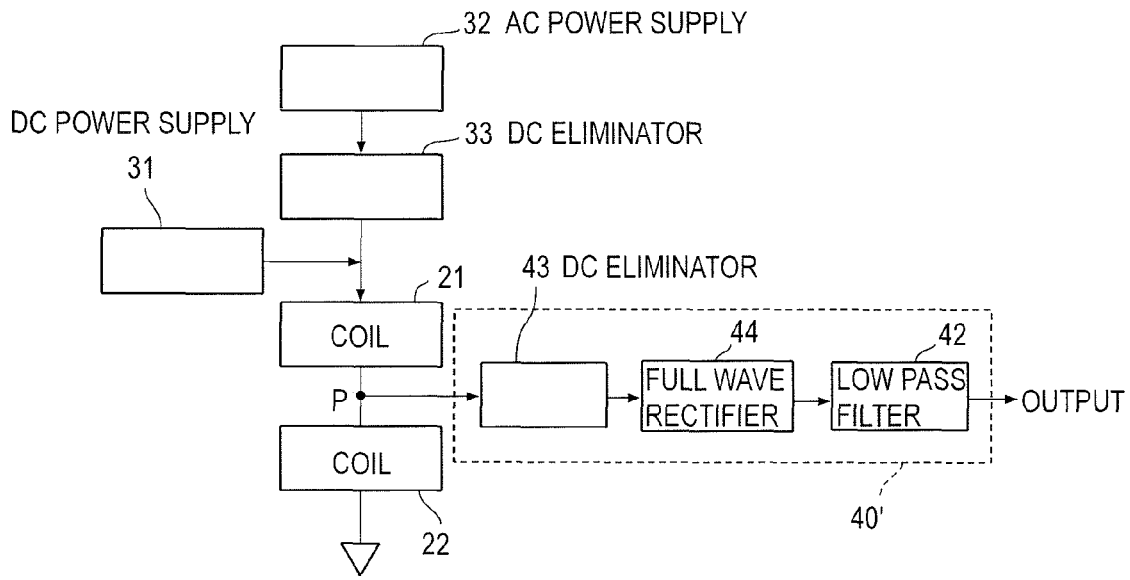
FIG. 4 is a block diagram illustrating a functional configuration in a second embodiment of a current sensor according to the present invention.

FIG. 4 is illustrates a functional configuration in a second embodiment of a current sensor according to the present invention as a block diagram, and in this case, a detection circuit 40' is configured with a DC eliminator 43 that removes a DC component from the voltage in the connection point P of the coils 21, 22, a full wave rectifier 44 that rectifies the full wave of an output of the DC eliminator 43, and a low pass filter 42 that smooths an output of the full wave rectifier 44. Instead of the detection circuit 40 illustrated in FIG. 2, it is also possible to employ the detection circuit 40' of this type. The configuration may also use a half wave rectifier instead of the full wave rectifier 44.

Third Embodiment

Figure 5:
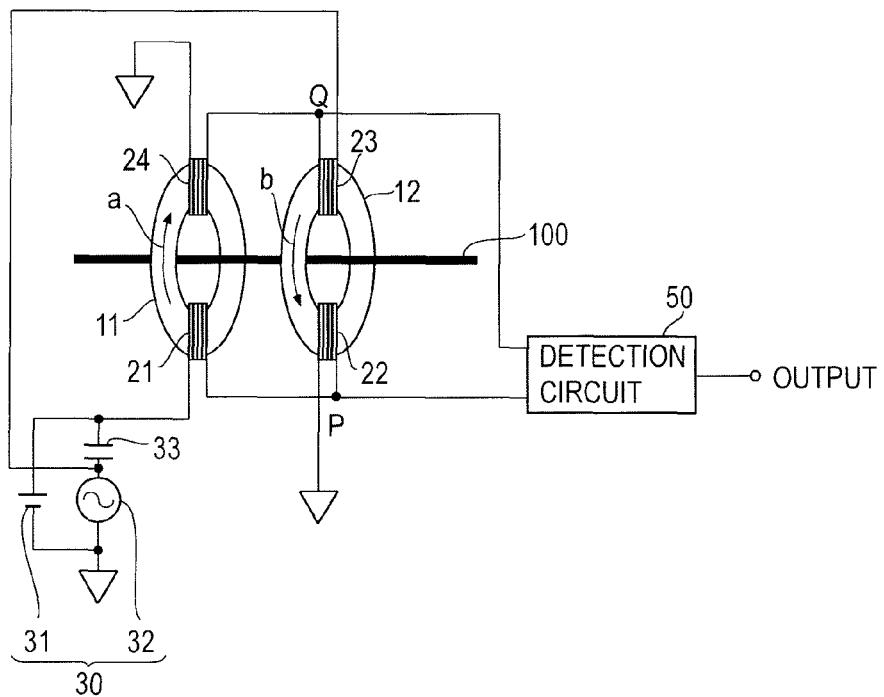
FIG. 5 is a diagram schematically illustrating a configuration in a third embodiment of a current sensor according to the present invention.
Figure 6:
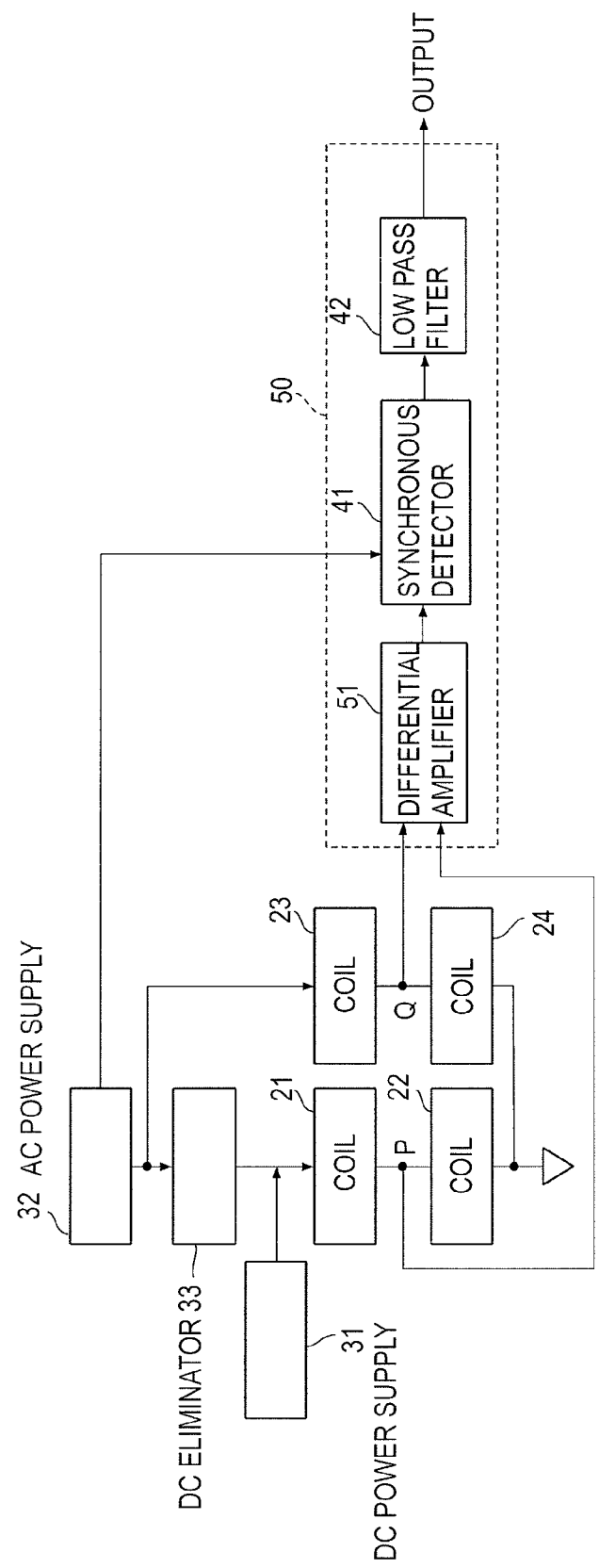
FIG. 6 is a block diagram illustrating a functional configuration in the third embodiment of a current sensor according to the present invention.

FIG. 5 schematically illustrates a configuration in a third embodiment of a current sensor according to the present invention, and FIG. 6 illustrates a functional configuration of the current sensor illustrated in FIG. 5 as a block diagram.

Relative to the configuration in the first embodiment, a coil 23 and a coil 24 are added to the configuration in this case. The coil 23 is wound around the core 12, and the coil 24 is wound around the core 11. The coils 23, 24 are connected in series to generate a magnetic flux in surrounding directions opposite to each other in the cores 11 and 12, similar to the coils 21, 22, when a current is applied to the coils 23, 24, and the AC power supply 32 is connected to one end of the one coil 23. The coil 23 is wound to generate a magnetic flux in the same surrounding direction as the coil 22, and the coil 24 is wound to generate a magnetic flux in the same surrounding direction as the coil 21.

By these coils 21 through 24, in this case, an inductance bridge is configured as illustrated in FIG. 6. The coils 21 through 24 are assumed to have an identical number of turns, and inductances L1 through L4 of the respective coils 21 through 24 are equal.

The AC voltage Vd in the connection point P of the coil 21 and the coil 22 and an AC voltage Vd' in a connection point Q of the coil 23 and the coil 24 become ½ of the AC excitation voltage Vac when the current flowing through the conductor 100 is 0. In contrast, when a current flows through the conductor 100 as in the first embodiment, the inductances L1, L4 of the coils 21, 24 decrease and the inductances L2, L3 of the coils 22, 23 increase. This causes the AC voltage Vd in the connection point P to increase and the AC voltage Vd' in the connection point Q decreases.

To the connection points P, Q, a detection circuit 50 is connected. The detection circuit 50 in this case comprises, as illustrated in FIG. 6, a differential amplifier 51, the synchronous detector 41, and the low pass filter 42. The differential amplifier 51 amplifies the difference between the voltages in the connection points P, Q. The synchronous detector 41 synchronously detects the voltage amplified by the differential amplifier 51 using the AC excitation voltage Vac of the excitation power supply 30, and an output of the synchronous detector 41 is provided after being smoothed by the low pass filter 42.

Figure 7:
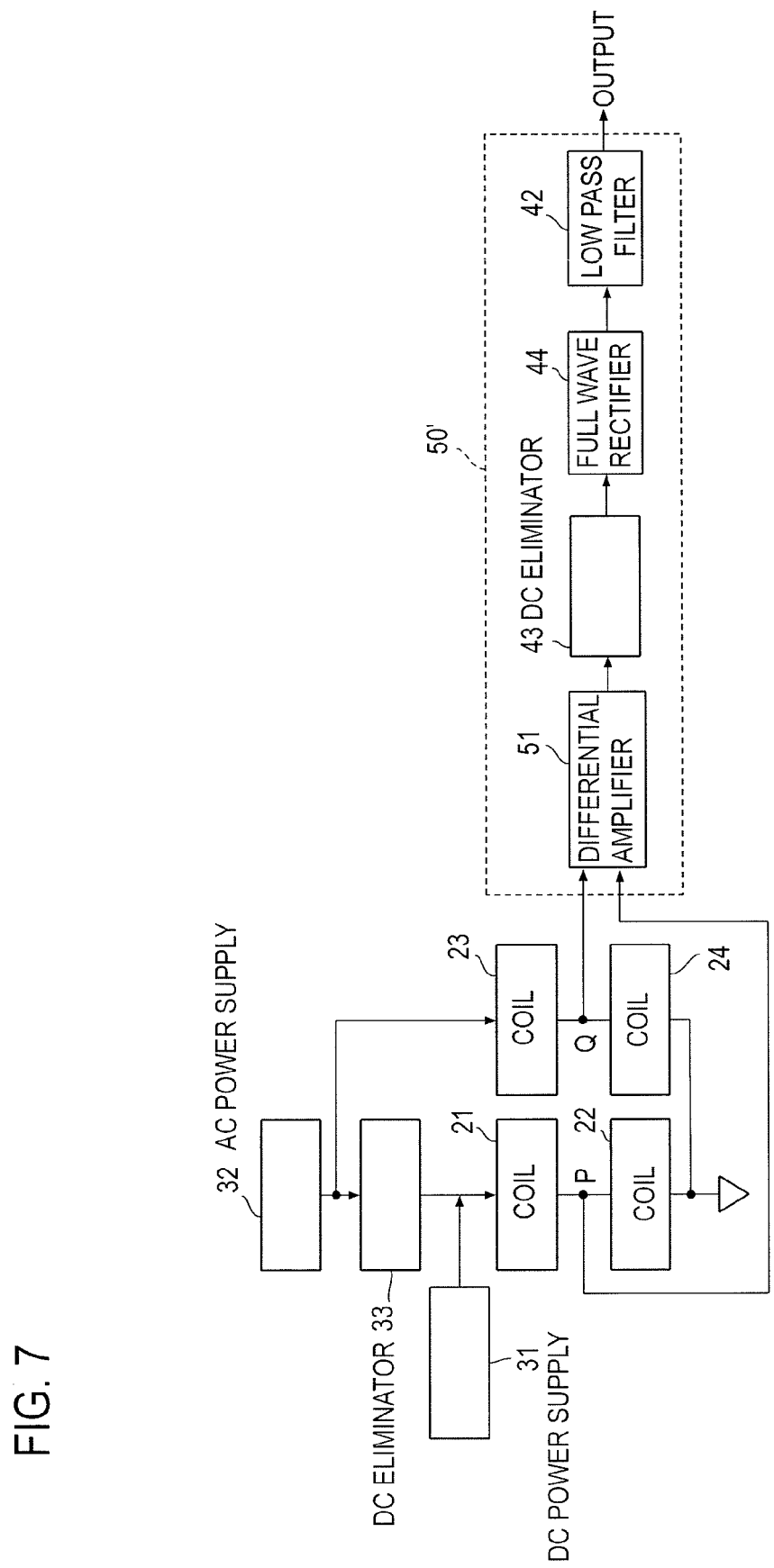
FIG. 7 is a block diagram illustrating a modification of a functional configuration in the third embodiment of a current sensor according to the present invention.

The detection circuit 50 with the configuration described above may also be replaced with a detection circuit 50', which includes the configuration of the detection circuit 40' illustrated in the second embodiment and the differential amplifier 51 as illustrated in FIG. 7.

Fourth Embodiment

Figure 8:
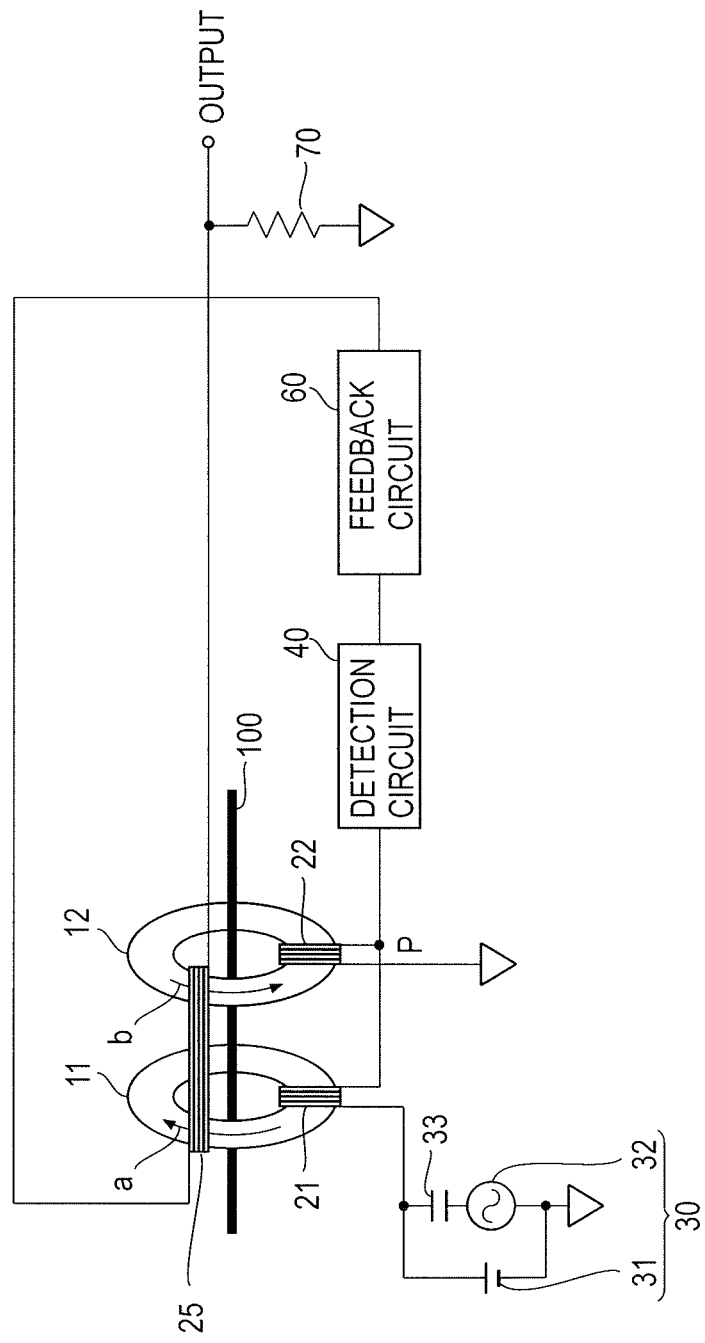
FIG. 8 is a diagram schematically illustrating a configuration in a fourth embodiment of a current sensor according to the present invention.
Figure 9:
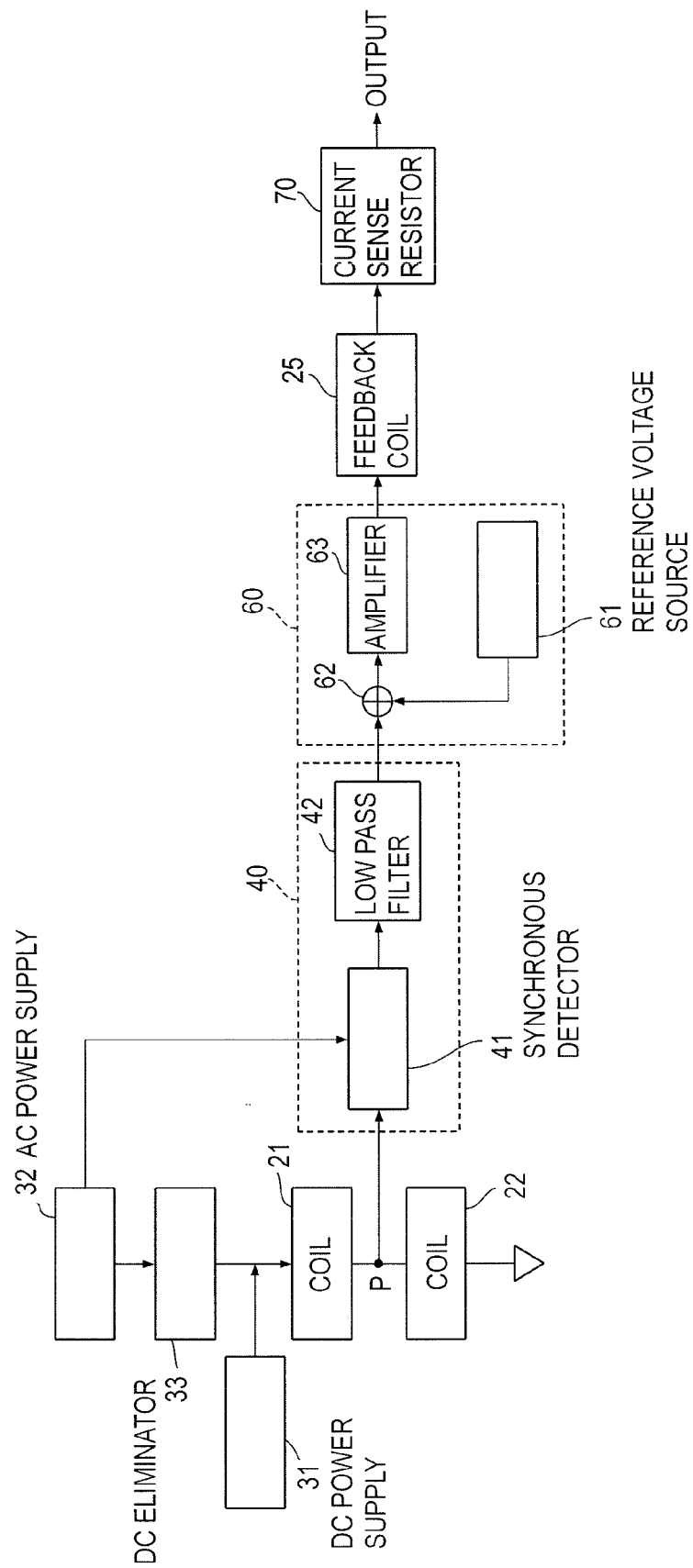
FIG. 9 is a block diagram illustrating a functional configuration in the fourth embodiment of a current sensor according to the present invention.

Next, descriptions are given to a configuration in a fourth embodiment of a current sensor according to the present invention with reference to FIG. 8 and FIG. 9.

Relative to the configuration in the first embodiment illustrated in FIG. 1 and FIG. 2, a feedback coil 25, a feedback circuit 60, and a current sense resistor 70 are added to the configuration in this case.

The feedback coil 25 is wound around the cores 11, 12 to magnetically equilibrate the cores 11, 12. The feedback circuit 60 is connected to a subsequent stage of the detection circuit 40. The feedback circuit 60 comprises a reference voltage source 61 to generate a reference voltage, an adder 62 to add an output of the detection circuit 40 (output of the low pass filter 42) and the reference voltage, and an amplifier 63 to amplify the output of the adder 62 and flow a feedback current through the feedback coil 25.

The current sense resistor 70 converts the feedback current flowing through the feedback coil 25 to a voltage and outputs the voltage.

The reference voltage generated by the reference voltage source 61 is set to cancel an output voltage outputted from the low pass filter 42 to 0 V when the current flowing through the conductor 100 is 0. Accordingly, the feedback current becomes 0 when the current flowing through the conductor 100 is 0, and a current does not flow through the feedback coil 25. An output of the current sense resistor 70 becomes 0 V.

In the meanwhile, when a current flows through the conductor 100 as in the first embodiment, the output of the low pass filter 42 becomes greater than the output assumed when the current is 0, as described in the first embodiment. Accordingly, the output of the adder 62 becomes a positive voltage. This causes a positive feedback current to flow through the feedback coil 25, and the cores 11, 12 become a magnetic equilibrium state relative to the current flowing through the conductor 100. The feedback current is converted to a voltage by the current sense resistor 70 and then the voltage is outputted, and it is possible to measure the current flowing through the conductor 100 in this case by the output of the current sense resistor 70. The detection circuit 40 may also be replaced with the detection circuit 40'.

Fifth Embodiment

Figure 10:
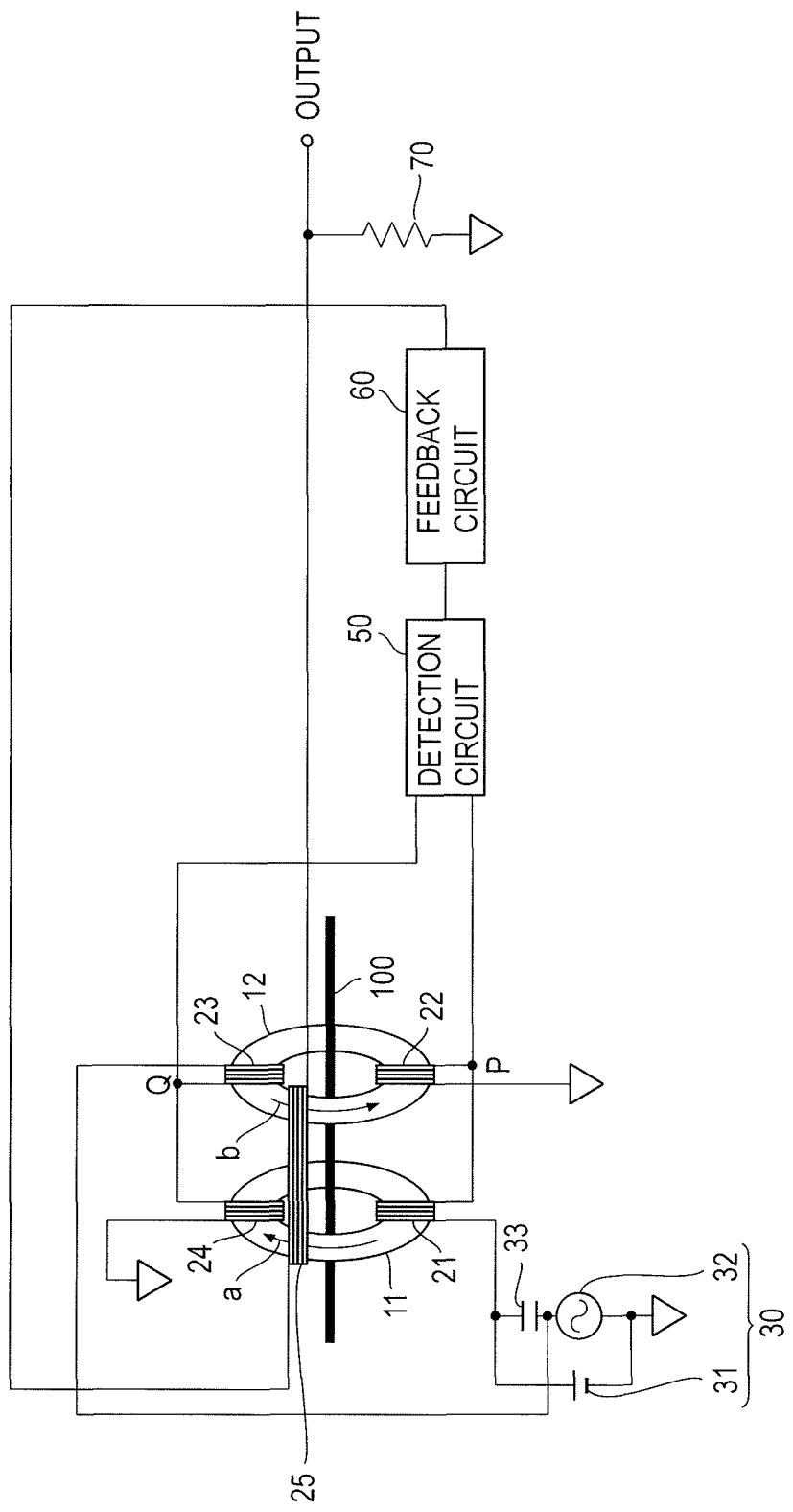
FIG. 10 is a diagram schematically illustrating a configuration in a fifth embodiment of a current sensor according to the present invention.

FIG. 10 schematically illustrates a configuration in a fifth embodiment of a current sensor according to the present invention, and relative to the configuration in the third embodiment illustrated in FIG. 5, the feedback coil 25, the feedback circuit 60, and the current sense resistor 70 are added to the configuration in this case, as in the fourth embodiment. In this case as well, it is possible to measure the current flowing through the conductor 100 by the output of the current sense resistor 70.

Although various embodiments of the present invention have been described above, the cores 11, 12 are not limited to toroidal cores and may also be in another shape, and for example, may also be cores in a quadrilateral shape. In addition, instead of the DC power supply 31, a DC constant current source may also be used.

What is claimed is:
1. A current sensor, comprising:
   two cores that configure closed magnetic circuits surrounding a conductor where a current to be measured flows and are arranged adjacent to each other;
   two coils that are wound respectively around the two cores and are connected in series to generate a magnetic flux in surrounding directions opposite to each other in the two cores;
   an excitation power supply that applies an AC current with a superimposed DC current to the two coils; and
   a detection circuit that is connected to a connection point of the two coils;
   wherein the detection circuit comprises a synchronous detector that synchronously detects a voltage in the connection point using an AC excitation voltage of the excitation power supply, and a low pass filter that smooths an output of the synchronous detector.

2. The current sensor according to claim 1,
   wherein a feedback coil, a feedback circuit, and a current sense resistor are provided,
   the feedback coil is wound around the two cores to magnetically equilibrate the two cores,
   the feedback circuit comprises a reference voltage source to generate a reference voltage, an adder to add an output of the low pass filter and the reference voltage, an amplifier to amplify an output of the adder and flow a feedback current through the feedback coil, and
   the feedback current is converted to a voltage by the current sense resistor and then the voltage is outputted.

3. A current sensor, comprising:

two cores that configure closed magnetic circuits surrounding a conductor where a current to be measured flows and are arranged adjacent to each other;

two coils that are wound respectively around the two cores and are connected in series to generate a magnetic flux in surrounding directions opposite to each other in the two cores;

an excitation power supply that applies an AC current with a superimposed DC current to the two coils; and a detection circuit that is connected to a connection point of the two coils;

wherein the detection circuit comprises a DC eliminator that removes a DC component of a voltage in the connection point, a full wave rectifier that rectifies full wave of an output of the DC eliminator, and a low pass filter that smooths an output of the full wave rectifier.

4. The current sensor according to claim 3, wherein a feedback coil, a feedback circuit, and a current sense resistor are provided, the feedback coil is wound around the two cores to magnetically equilibrate the two cores, the feedback circuit comprises a reference voltage source to generate a reference voltage, an adder to add an output of the low pass filter and the reference voltage, an amplifier to amplify an output of the adder and flow a feedback current through the feedback coil, and the feedback current is converted to a voltage by the current sense resistor and then the voltage is outputted.

5. A current sensor comprising:

two cores that configure closed magnetic circuits surrounding a conductor where a current to be measured flows and are arranged adjacent to each other;

first and fourth coils that are wound around one of the two cores to generate a magnetic flux in a same surrounding direction;

a second coil that is connected in series to the first coil and is wound around another of the two cores to generate a magnetic flux in a surrounding direction opposite to the surrounding direction of the magnetic flux generated by the first coil;

a third coil that is connected in series to the fourth coil and is wound around another of the two cores to generate a magnetic flux in a surrounding direction opposite to the surrounding direction of the magnetic flux generated by the fourth coil;

an excitation power supply that applies an AC current with a superimposed DC current to the first and second coils and applies the AC current to the third and fourth coils; and a detection circuit that is connected to a connection point of the first coil and the second coil and a connection point of the third coil and the fourth coil.

6. The current sensor according to claim 5, wherein the detection circuit comprises a differential amplifier that amplifies a difference between voltages in the both connection points, a synchronous detector that synchronously detects an output of the differential amplifier using an AC excitation voltage of the excitation power supply, and a low pass filter that smooths an output of the synchronous detector.

7. The current sensor according to claim 5, wherein the detection circuit comprises a differential amplifier that amplifies a difference between voltages in the both connection points, a DC eliminator that removes a DC component of an output of the differential amplifier, a full wave rectifier that rectifies full wave of an output of the DC eliminator, and a low pass filter that smooths an output of the full wave rectifier.

8. The current sensor according to claim 6, wherein a feedback coil, a feedback circuit, and a current sense resistor are provided, the feedback coil is wound around the two cores to magnetically equilibrate the two cores, the feedback circuit comprises a reference voltage source to generate a reference voltage, an adder to add an output of the low pass filter and the reference voltage, an amplifier to amplify an output of the adder and flow a feedback current through the feedback coil, and the feedback current is converted to a voltage by the current sense resistor and then the voltage is outputted.

9. The current sensor according to claim 7, wherein a feedback coil, a feedback circuit, and a current sense resistor are provided, the feedback coil is wound around the two cores to magnetically equilibrate the two cores, the feedback circuit comprises a reference voltage source to generate a reference voltage, an adder to add an output of the low pass filter and the reference voltage, an amplifier to amplify an output of the adder and flow a feedback current through the feedback coil, and the feedback current is converted to a voltage by the current sense resistor and then the voltage is outputted.

* * * * *